United States Patent [19]
Ash

[11] Patent Number: 4,749,964
[45] Date of Patent: Jun. 7, 1988

[54] SUPERREGENERATIVE DETECTOR HAVING A SAW DEVICE IN THE FEEDBACK CIRCUIT

[75] Inventor: Darrell L. Ash, Sachse, Tex.

[73] Assignee: R. F. Monolithics, Inc., Dallas, Tex.

[21] Appl. No.: 939,527

[22] Filed: Dec. 8, 1986

[51] Int. Cl.⁴ .............................................. H03B 5/00
[52] U.S. Cl. .................................. 331/107 A; 329/122
[58] Field of Search ............... 331/107 A, 116 R, 155, 331/158, 117 R; 329/122

[56] References Cited
U.S. PATENT DOCUMENTS
3,868,595  2/1975  Capps, Jr. et al. ............. 331/107 A OTHER PUBLICATIONS
Frederick Terman, Detectors and Mixers, Chapter 16, pp. 566–568.

Primary Examiner—Eugene R. LaRoche
Assistant Examiner—Robert J. Pascal
Attorney, Agent, or Firm—Alfred E. Hall

[57] ABSTRACT

A superregenerative detector utilizing a single transistor and having a surface acoustic wave device in the feed back loop coupling the output to the input to cause oscillation wherein the surface acoustic wave device is a low loss delay line formed as a single phase unidirectional transducer on a quartz substrate.

12 Claims, 4 Drawing Sheets

SUPERREGENERATIVE DETECTOR HAVING A SAW DEVICE IN THE FEEDBACK CIRCUIT

BACKGROUND OF THE INVENTION

The present invention relates to a superregenerative detector and in particular to a superregenerative-detector having a surface acoustic wave device in the feed back loop of the oscillator to cause oscillations.

The superregenerative detector is a regenerative circuit in which an ordinary oscillator is automatically switched between an oscillating and a nonoscillating condition at a low radio frequency rate. The switching frequency is called the "quenching" frequency. In general, the quenching frequency is increased as the carrier modulation frequency becomes greater. With proper adjustment, oscillations will build up in the detector near the positive peaks of each cycle of the low frequency "quench" voltage and will die out when the voltage is negative or too low to provide oscillating conditions. The signal voltage that is to be detected is connected to a feedback loop which is connected to a transistor amplifier to cause oscillation.

In the absence of an applied signal, the oscillations that build up during each cycle of the quench voltage start with an initial amplitude determined by the noise voltages in the input circuit and reach a final value corresponding to the equilibrium value for the oscillator. These oscillations then die out as the "quench" voltage becomes small and then goes negative or too low to provide oscillating conditions. If an RF carrier is superimposed upon the system and is larger in magnitude than the thermal agitation noises in the tuned input circuit, the initial amplitude, as the oscillations start to build up, corresponds to the amplitude of the superimposed RF signal. The oscillations, therefore, reach their equilibrium more quickly because of the larger initial amplitude. The quenching frequency can be simply adjusted by altering the value of an RC circuit connected to the base of the detector transistor. The RF carrier is amplitude modulated with a desired information signal which is recovered at the output of the detector with a low pass filter which rejects the RF carrier and the quench signal.

This type of circuit is valuable because it is simple and economical to construct and it suppresses noise pulses of short duration because in superregeneration, the system is sensitive to the incoming signal for only a small fraction of the total time. It is desirable to use such circuits in components such as receivers for garage door openers, portable telephones and the like because of their small size, ease of construction and economy of construction.

However, they have some severe disadvantages. In the first place they are normally LC controlled. That is, they utilize inductors and capacitors in the feed back circuits which causes the oscillator to be unstable over time and to drift from its desired frequency of operation. In addition, any LC circuit is temperature sensitive which causes the frequency of operation to change with temperature change. Further, superregenerative receivers in the prior art have relatively wide reception bands and are therefore influenced by stray signals and noise which they can pick up and detect.

To overcome these problems, it is necessary to use a feed back circuit which has a low loss, is temperature stable, and provides the necessary phase shift from the output to the input to cause oscillation of the detector.

A surface acoustic wave delay line device is very temperature stable and would be ideal to place in the feedback circuit as a phase shift element except that the prior art surface acoustic wave delay lines have an insertion loss which is so high that sufficient feedback cannot occur with a single transistor oscillator.

Prior art resonators which are formed of SAW devices have low insertion loss but have a Q that is so high that the quench circuit cannot function properly. Thus to construct a superregenerative detector with prior art SAW devices would prohibit the construction of a superregenerative detector with a single transistor and would have to be quite complex using a separate quench oscillator and other circuits which would negate simplicity and economy of construction.

The present invention relates to a superregenerative receiver which does in fact utilize a surface acoustic wave device in the feed back circuit which is not only a delay line but is also a low loss device. Thus, it allows the construction of a superregenerative detector with one transistor, is temperature stable, is not LC controlled, does not drift in frequency, and has a very narrow reception band therefore eliminating the reception of noise and stray signals which are close to the operating frequency of the detector. The ideal SAW device to be used is formed as a single phase unidirectional transducer with quarter wave length electrodes and spacing thus allowing operation of the detector at very high frequencies.

Thus it is an object of the present invention to provide a superregenerative detector including an oscillator having an output and an input and a surface acoustic wave device forming a feed back loop for coupling the output to the input to cause oscillations.

It is also an object of the present invention to couple a modulated RF signal to the oscillator input and a low pass filter to the output to recover the modulation signal.

It is still another object of the present invention to provide a superregenerative detector wherein the surface acoustic wave device which forms the feed back loop for coupling the output to the input to cause oscillations is a low loss device and a delay line.

It is yet another object of the present invention to provide a superregenerative detector which has a surface acoustic wave device forming a feed back loop for coupling the output to the input to cause oscillations and wherein the SAW device is a single phase unidirectional transducer formed with λ/4 electrodes.

SUMMARY OF THE INVENTION

Thus the present invention relates to a superregenerative detector comprising an oscillator having a signal output and a signal input and a surface acoustic wave device forming a feed back loop for coupling the signal output to the input to cause oscillations.

The invention also relates to method of forming a superregenerative detector comprising the steps of forming an oscillator having a signal output and a signal input, and coupling the signal output to the input with a surface acoustic wave device forming a feed back loop to cause oscillations.

BRIEF DESCRIPTION OF THE DRAWINGS

These and other objects of the present invention will be disclosed in conjunction with the accompanying drawings in which.

DETAILED DESCRIPTION OF THE DRAWINGS

Figure 1:
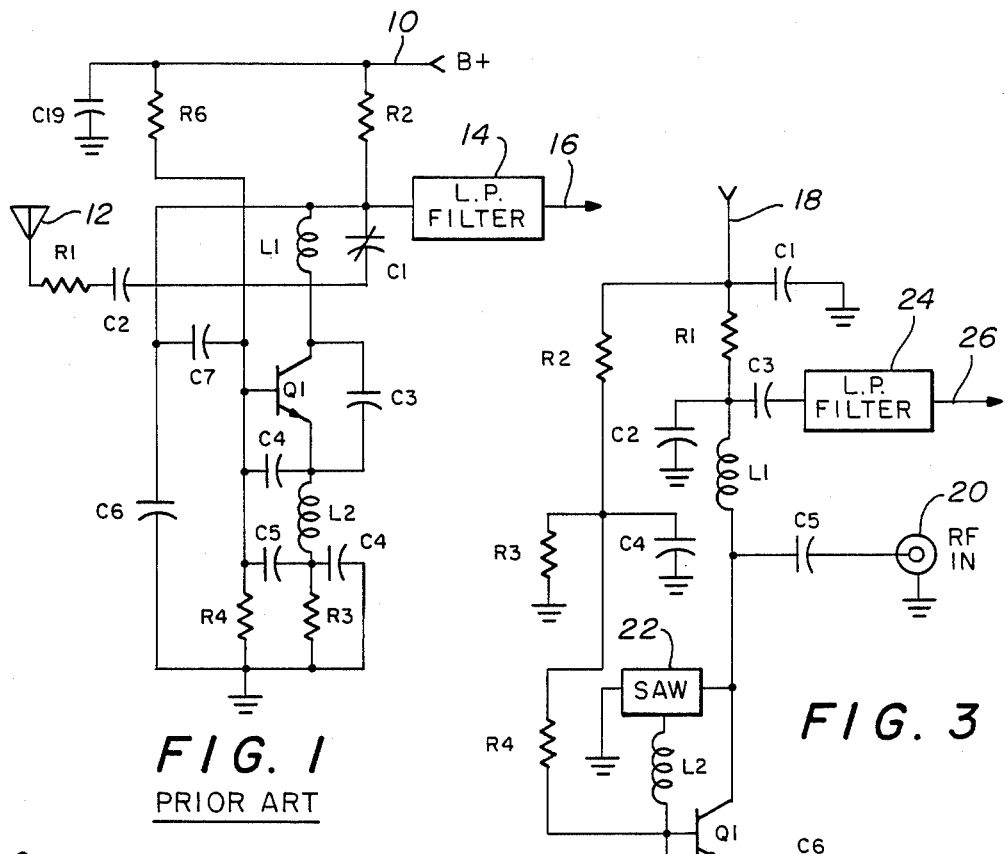
FIG. 1 is a circuit diagram of a prior art superregenerative detector.

FIG. 1 is a circuit diagram of a prior art superregenerative receiver. The basic component of the circuit is transistor Q1 which receives B+ voltage on line 10 through resistor R2 and the tank circuit L1C1. The quiescent base voltage is determined by resistors R4 and R6 and a feed back circuit from the output collector to the input on the emitter is comprised of capacitors C3 and C4, C6 and C7. Capacitor C5 determines the quench frequency rate and is selected in size to determine the desired quench frequency of the oscillator.

When a modulated RF signal is received by antenna 12, it is coupled through resistor R1 and capacitor C2 to the tank circuit formed of L1C1 and to the collector of transistor Q1. This modulated RF signal voltage is superimposed upon the system and is coupled through the feed back loop comprised of capacitors C3 and C4 to the emitter of transistor Q1 which causes oscillations to start to build up. Each time transistor Q1 conducts due to the quench voltage, the modulated RF signal voltage is superimposed on it and is coupled through tank circuit L1C1 to low pass filter 14 which removes the carrier and the quench frequency and allows the modulation signal to be transmitted on line 16 to additional circuits for further processing.

As stated earlier this circuit is economical to construct since it utilizes only one transistor and has few components but because it is LC controlled, the frequency drifts and the unit is unstable. It is also temperature variable which also causes the frequency to drift and it has a wide reception band and is therefore influenced by stray signals which it can pick up and recover.

Figure 2:
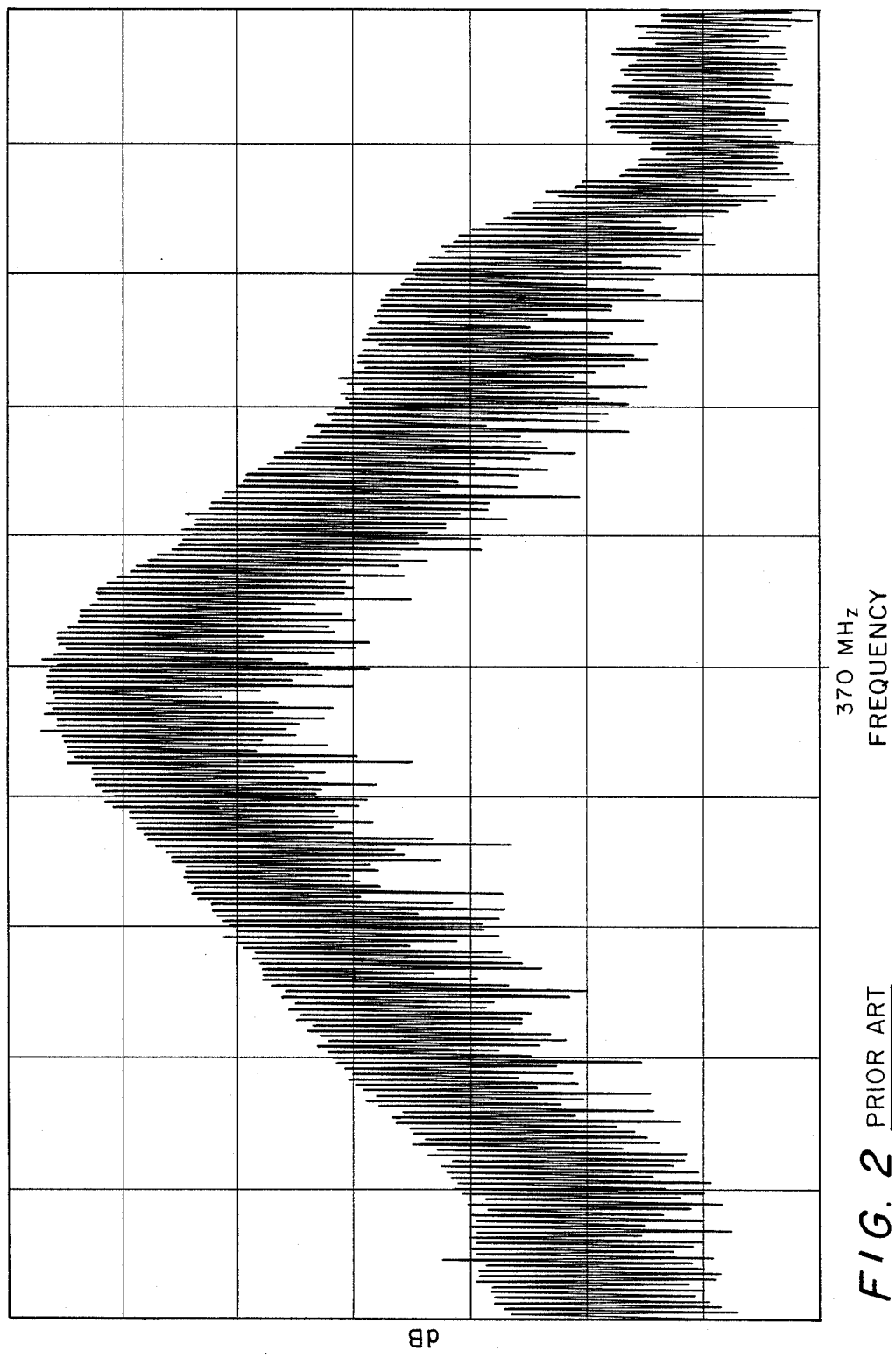
FIG. 2 is a graph representing the frequency response of the prior art super-regenerative detector.

FIG. 2 is a diagram of the frequency response of the prior art superregenerative detector shown in FIG. 1. The center frequency is approximately 370 MHz and each of the horizontal frequency divisions is approximately 20 MHz. The vertical scale represents the signal level in dB and represents 10 dB per division. It will be noted that at the 3 dB points of this curve, the band width is approximately 30 MHz. This means of course that the receiver will be sensitive to at least any signal within that 30 MHz range. Thus the prior art receiver is subject to receiving many other signals which it would be desirable to eliminate.

Figure 3:
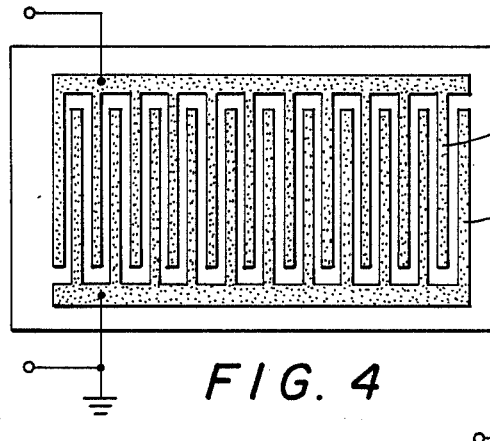
FIG. 3 is a circuit diagram of the novel superregenerative detector of the present invention.

The novel superregenerative detector of the present invention which eliminates the problems of the prior art is illustrated in FIG. 3. Again, a single transistor Q1 is utilized as the heart of the circuit. The DC voltage on line 18 is coupled through resistor R1 and inductor L1 to the collector of transistor Q1. Capacitor C7 couples the emitter of the transistor to the base and determines the quench frequency of the circuit. The modulated RF input signal on input terminal 20 is coupled through capacitor C5 to the collector of transistor Q1 and to the feed back loop comprising SAW device 22 and inductor L2. The signal coupled through the feed back loop comprising the SAW device 22 and the inductor L2 raises the signal level at the base of transistor Q1 when added to the voltage developed on capacitor C7 to cause transistor Q1 to break into oscillations more quickly than when the thermal noise alone is providing the input voltage.

Figure 4:
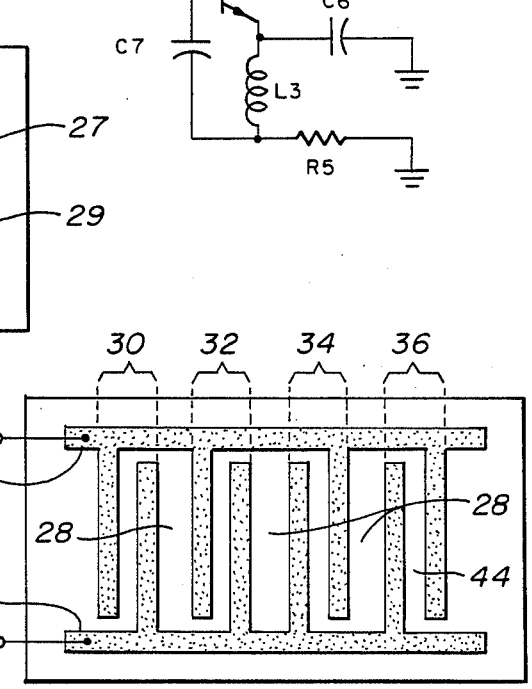
FIG. 4 is a diagrammatic representation of a single phase unidirectional transducer using quarter wavelength electrodes which can be used as the SAW device in the feed back loop of the circuit shown in FIG. 3.
Figure 5:
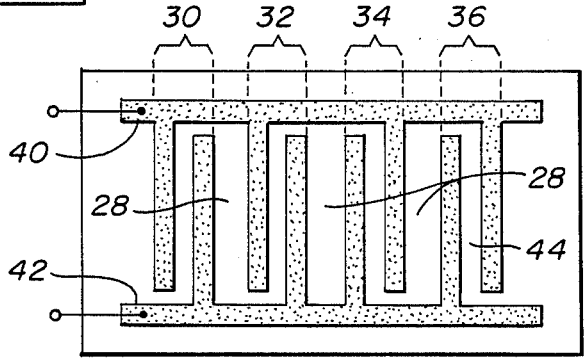
FIG. 5 is a diagrammatic representation of a reflectionless transducer of a surface acoustic wave device which can be used in the feed back loop of the novel invention shown in the diagram in FIG. 3.

SAW device 22 will function properly as a feed back device only if it has a low loss in the circuit and has a low Q. A single phase unidirectional transducer has the proper characteristics for use as the SAW device 22 in the feed back circuit. Such transducer is disclosed in commonly assigned co-pending application Ser. No. 677,513 filed Dec. 3, 1984, and entitled SINGLE PHASE UNIDIRECTIONAL SURFACE ACOUSTIC WAVE TRANSDUCER which is incorporated herein by reference. Such transducer is shown in FIG. 4 and utilizes quarter wave length electrodes 27 and 29. As described in commonly assigned copending application Ser. No. 677,513, the unidirectional nature of the transducer is obtained by selectively positioning the transducer on a particular substrate material having a prescribed crystal orientation so as to cause wave propagation in a desired direction in said substrate. In addition, a low loss transducer such as that shown in commonly assigned copending application Ser. No. 891,237 filed July 29, 1986 and entitled REFLECTIONLESS TRANSDUCER, incorporated herein by reference, may be used. This transducer has at least two groups of interdigitated electrodes 30, 32, 34 and 36 extending from opposed conductive pads 40 and 42, each group of electrodes having a spacing 44 within the group of $\lambda/4$ and the spaces 28 between adjacent groups having a spacing of $\lambda/2$ so that adjacent groups cancel reflections from each other. By mass loading alternate ones of said groups of electrodes, a substantial unidirectional wave propagation in the substrate is achieved. Such transducer is shown in FIG. 5 with a spacing or cavity 28 of $\lambda/2$ between electrode groups 30 and 32, 32 and 34 and 34 and 36 and a $\lambda/4$ spacing 44 between electrodes within the groups 30, 32, 34 and 36. The construction with quarter wavelength electrodes allows the use of the greatest frequency which can be achieved with present state of the art SAW devices. Further, the device is a low loss device.

The output of transistor Q1 is coupled through inductor L1 and capacitor C3 to low pass filter 24 to recover the modulation signal. The output of low pass filter 24 is coupled on line 26 to additional circuits as necessary such as amplifiers.

Inductors L1 and L2 are air wound coils utilizing number 28 gauge wire on an 0.080 inch form for the particular circuit shown in FIG. 3. Inductor L1 is a fine adjustment for the center frequency of oscillation which is primarily determined by the SAW device 22 with L2 being constant. Inductor L2 does affect the center frequency a small amount but its real purpose is to adjust the power level of the oscillator by matching the impedance of the SAW device to the oscillator which affects the feed back ratio. The inductor L1 is used to match transistor Q1 and the surface acoustic wave device 22. As stated earlier, capacitor C7 is selected in size to adjust the quench frequency.

Figure 6:
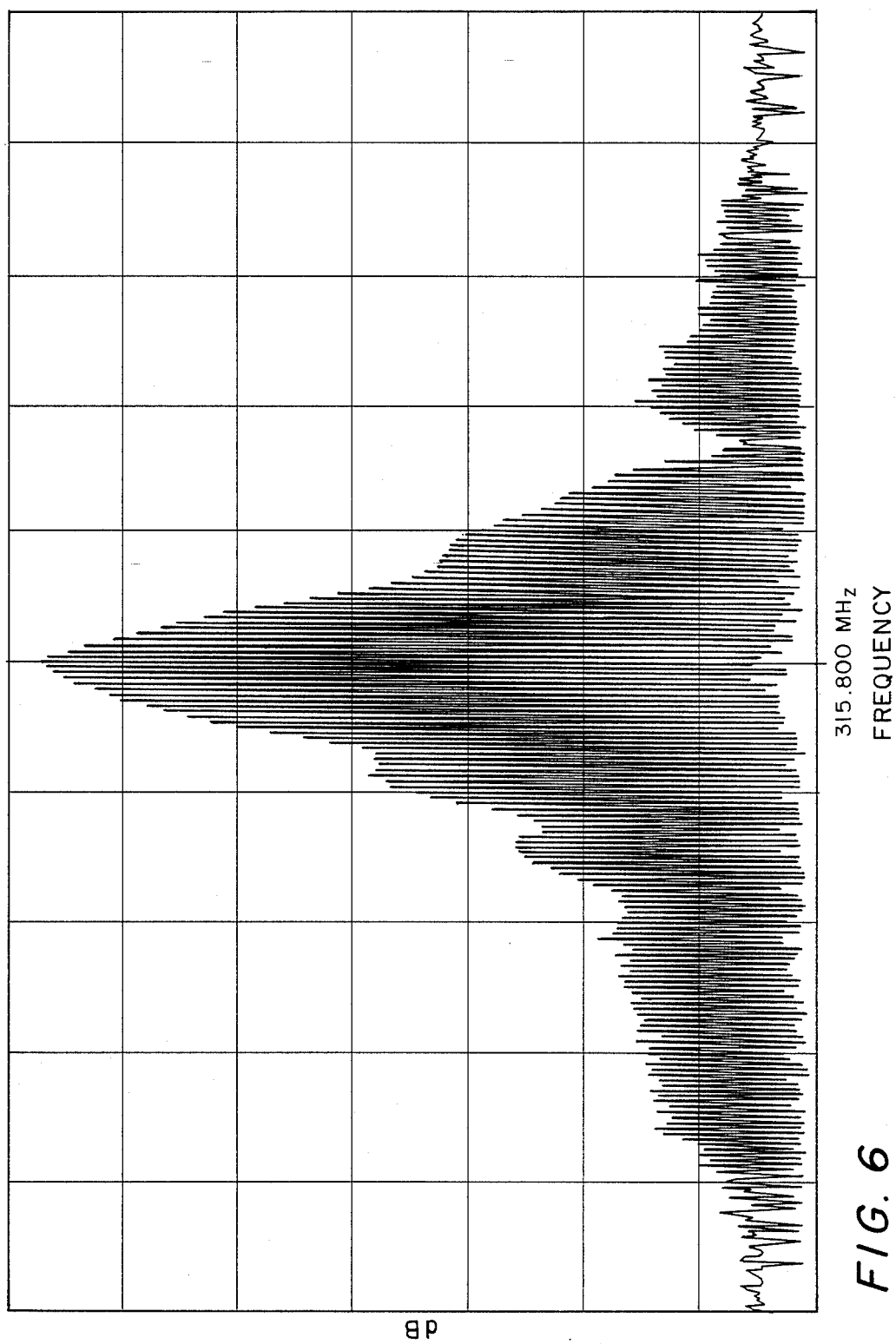
FIG. 6 is a graph illustrating the frequency response of the novel superregenerative detector shown in FIG. 3.

A graph of the frequency response of the novel device is illustrated in FIG. 6. The horizontal axis represents frequency at 1 MHz per division and the vertical axis represents signal level with 10 dB per division. Note that the horizontal scale of FIG. 6 is one-twentieth that of the frequency response of the prior art device shown in FIG. 2. Thus, in FIG. 6, at the 3 dB point, the band width is approximately 200 KHz. Thus the novel superregenerative detector shown in FIG. 3 is extremely selective and eliminates all stray signals except those within an approximately 200 KHz band width with this particular circuit.

Figure 7:
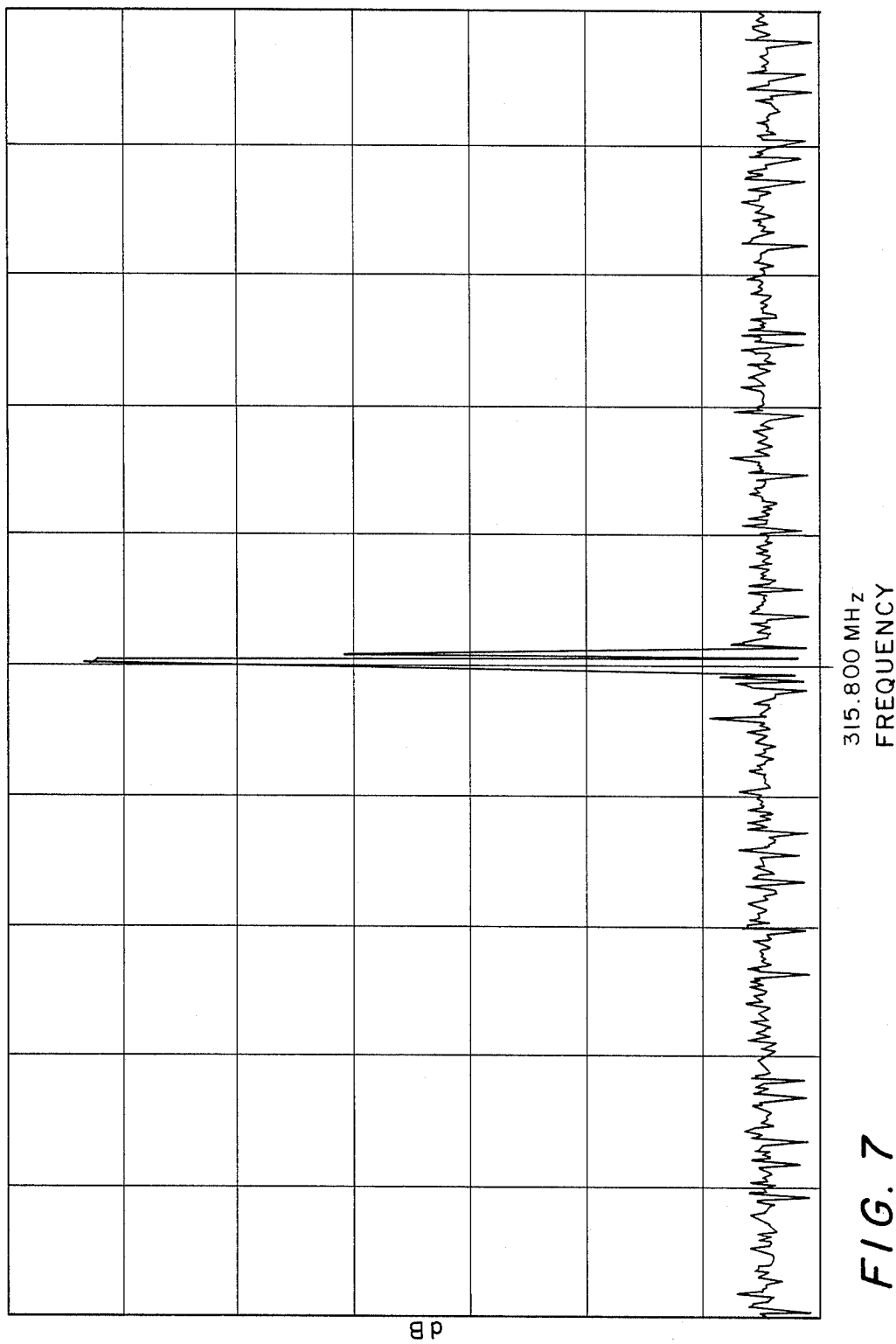
FIG. 7 is a graph of the frequency response of the novel superregenerative detector shown in FIG. 3 shown on a broader frequency scale.

FIG. 7 illustrates the same frequency response shown in FIG. 6 except using a scale comparable to that shown for the prior art device in FIG. 2 which is 20 MHz per division. Note the sharp frequency response curve of the present invention in FIG. 7 as compared to the frequency response of the prior art device shown in FIG. 2. It can be readily seen that extraneous noise on either side of the 200 KHz band width at the 3 dB point is essentially eliminated.

Thus, the present invention provides a superregenerative receiver utilizing a SAW device in the feed back loop to cause oscillations. The SAW device is a low loss delay line formed with a single phase unidirectional transducer. The greater the delay of the SAW device the more stable is the oscillator because the phase of the signal through the SAW device exhibits a steep slope thereby minimizing the effects of any phase shift on the oscillator center frequency due to any other circuit elements. However, the delay also affects the maximum quench rate so the amount of delay is limited by the quench rate that is desired to be used. Delay also affects or determines the band width of the receiver. The more the delay, the higher the Q and the narrower the band. Thus, the amount of delay that can be used is also limited by the stability of the transmitter.

This circuit also has extremely good temperature characteristics since it is primarily controlled by the SAW device which has a very good temperature response. That is to say they do not change their frequency response very much with temperature changes. Of course, the temperature response of a SAW device varies with the type of substrate material on which the transducer is placed as well as the direction in which the waves are transmitted through the substrate as is well-known in the art. It is preferable that the substrate be quartz but it could also be used on other types of substrates such as, for example, lithium niobate or lithium tantalate even though the temperature coefficient is not as good as quartz.

The novel detector is very sensitive as can be seen in FIG. 7 due to the comparatively narrow bandwidth and can readily pick the signal out of the noise level since the signal to noise ratio is much greater than in the prior art.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:
1. A superregenerative detector comprising:
   a. an RF oscillator having an output and an input,
   b. a surface acoustic wave device forming a feedback loop for coupling said output to said input to cause said RF oscillations to occur, and
   c. a quench oscillator coupled to said RF oscillator for switching said RF oscillator between an oscillating and a non-oscillating condition.
2. A detector as in claim 1 further comprising:
   a. means for coupling a modulated RF signal to said oscillator input; and
   b. a low pass filter means coupled to said output to recover said modulation.
3. A detector as in claim 2 wherein said surface acoustic wave device is a low loss device.
4. A detector as in claim 3 wherein said SAW device is a delay line.
5. A detector as in claim 4 wherein said SAW device is a single phase unidirectional transducer formed on a piezoelectric substrate and has $\lambda/4$ electrodes.
6. A detector as in claim 5 wherein SAW device is formed on a quartz crystal substrate.
7. A method of constructing a superregenerative detector comprising the steps of:
   a. forming an RF oscillator having an output and an input,
   b. coupling said output to said input with a surface acoustic wave device forming a feedback loop to cause said RF oscillations, and
   c. coupling a quench oscillator to said RF oscillator for switching said RF oscillator between an oscillating and a non-oscillating condition.
8. A method as in claim 7 further comprising the steps of:
   a. coupling a modulated RF signal to said oscillator input, and
   b. coupling a low pass filter means to said output to recover said modulation.
9. A method as in claim 8 further comprising the step of using a low loss surface acoustic wave device in said feed back loop.
10. A method as in claim 9 further including the step of using a surface acoustic wave delay line in said feed back loop.
11. A method as in claim 10 further comprising the step of using a single phase unidirectional transducer formed with $\lambda/4$ electrodes on a piezoelectric substrate as said SAW device.
12. A method as in claim 11 further comprising the step of forming said surface acoustic wave device on a quartz crystal substrate.

* * * * *